(12) United States Patent
Bu et al.

(10) Patent No.: US 10,224,429 B2
(45) Date of Patent: *Mar. 5, 2019

(54) PRECISE JUNCTION PLACEMENT IN VERTICAL SEMICONDUCTOR DEVICES USING ETCH STOP LAYERS

(71) Applicant: INTERNATIONAL BUSINESS MACHINES CORPORATION, Armonk, NY (US)

(72) Inventors: Huiming Bu, Glenmont, NY (US); Liying Jiang, Guilderland, NY (US); Siyuranga O. Koswatta, Carmel, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/652,924

(22) Filed: Jul. 18, 2017

(65) Prior Publication Data

US 2017/0365714 A1 Dec. 21, 2017

Related U.S. Application Data

(63) Continuation of application No. 15/182,906, filed on Jun. 15, 2016, now Pat. No. 9,954,101.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 21/0257* (2013.01); *H01L 21/02543* (2013.01); *H01L 21/30612* (2013.01); *H01L 29/0847* (2013.01); *H01L 29/20* (2013.01); *H01L 29/66356* (2013.01); *H01L 29/66522* (2013.01); *H01L 29/66666* (2013.01); *H01L 29/7391* (2013.01);
(Continued)

(58) Field of Classification Search
CPC ........ H01L 29/66666; H01L 29/66787; H01L 29/7827

See application file for complete search history.

(56) References Cited

U.S. PATENT DOCUMENTS 5,504,359 A    4/1996  Rodder
8,026,509 B2   9/2011  Goel et al.
(Continued)

OTHER PUBLICATIONS

List of IBM Patents or Patent Applications Treated as Related dated Jul. 18, 2017, 2 pages.

*Primary Examiner* — Stephen W Smoot
*Assistant Examiner* — Sun Mi Kim King
(74) *Attorney, Agent, or Firm* — Tutunjian & Bitetto, P.C.; Vazken Alexanian

(57) ABSTRACT

A semiconductor device is provided that includes a first of a source region and a drain region comprised of a first semiconductor material, wherein an etch stop layer of a second semiconductor material present within the first of the source region and the drain region. A channel semiconductor material is present atop the first of the source region and the drain region. A second of the source and the drain region is present atop the channel semiconductor material. The semiconductor device may be a vertically orientated fin field effect transistor or a vertically orientated tunnel field effect transistor.

20 Claims, 7 Drawing Sheets

(51) Int. Cl.
  *H01L 29/08*    (2006.01)
  *H01L 21/306*   (2006.01)
  *H01L 21/02*    (2006.01)
  *H01L 29/20*    (2006.01)
  *H01L 29/739*   (2006.01)
  *H01L 29/165*   (2006.01)
  *H01L 29/205*   (2006.01)

(52) U.S. Cl.
  CPC ...... *H01L 21/0254* (2013.01); *H01L 21/0262* (2013.01); *H01L 21/02576* (2013.01); *H01L 29/165* (2013.01); *H01L 29/205* (2013.01)

(56) References Cited

U.S. PATENT DOCUMENTS

| | | |
|---|---|---|
| 8,796,733 B2 | 8/2014 | Seabaugh et al. |
| 8,975,123 B2 | 3/2015 | Daley et al. |
| 9,466,729 B1 | 10/2016 | Fanelli |
| 9,805,968 B2 | 10/2017 | Lin et al. |
| 2015/0021683 A1 | 1/2015 | Xie et al. |

10,224,429 B2

PRECISE JUNCTION PLACEMENT IN VERTICAL SEMICONDUCTOR DEVICES USING ETCH STOP LAYERS

BACKGROUND

Technical Field

The present disclosure relates to methods of forming semiconductor devices, and more particularly to a method of forming junctions in vertical semiconductor devices.

Description of the Related Art

The dimensions of semiconductor field effect transistors (FETs) have been steadily shrinking, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

A method of fabricating a vertical fin field effect transistor (FinFET) that introduces an etch stop layer into at least one of a source region and a drain region, wherein in some embodiments the etch stop layer may be used to control the junction alignment in the device. In one embodiment, the method may include forming a first of a source or drain region having a majority composition of a first semiconductor material, wherein a semiconductor etch stop layer of a second semiconductor material having a different etch selectively than the first semiconductor material is present within said first of the source region or drain region. A material stack including a least a channel semiconductor material is formed atop the first of the source or drain region of the device. The material stack is etched to provide a channel region selectively to the semiconductor etch stop layer, wherein a depth of the semiconductor etch stop layer dictates overlap between said first of the source or drain region and the channel region of the device. A gate structures is formed on the channel region.

A method of fabricating a vertical tunnel field effect transistor (tunnel FET) that introduces an etch stop layer into at least one of a source region and a drain region, wherein in some embodiments the etch stop layer may be used to control the junction alignment in the device. In one embodiment, the method may include forming a first of a source or drain region having a majority composition of a first semiconductor material and a first conductivity type, wherein a semiconductor etch stop layer of a second semiconductor material having a different etch selectively than the first semiconductor material is present within said first of the source region or drain region. A material stack including at least a channel semiconductor material is formed atop the first of the source or drain region of the device. The material stack is etched to provide a channel region selectively to the semiconductor etch stop layer, wherein a depth of the semiconductor etch stop layer dictates overlap between said first of the source or drain region and the channel region of the device. A second of the source or the drain region having a second conductivity type is positioned on the channel region opposite the first of the source or the drain region.

In another aspect, a semiconductor device is provided that includes a first of a source region and a drain region comprised of a first semiconductor material, and an etch stop layer of a second semiconductor material present within the first of the source region and the drain region. A channel semiconductor material is present atop the first of the source region and the drain region, and a second of the source and the drain region is present atop the channel semiconductor material. The semiconductor device may be a vertically orientated fin field effect transistor or a vertically orientated tunnel field effect transistor.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
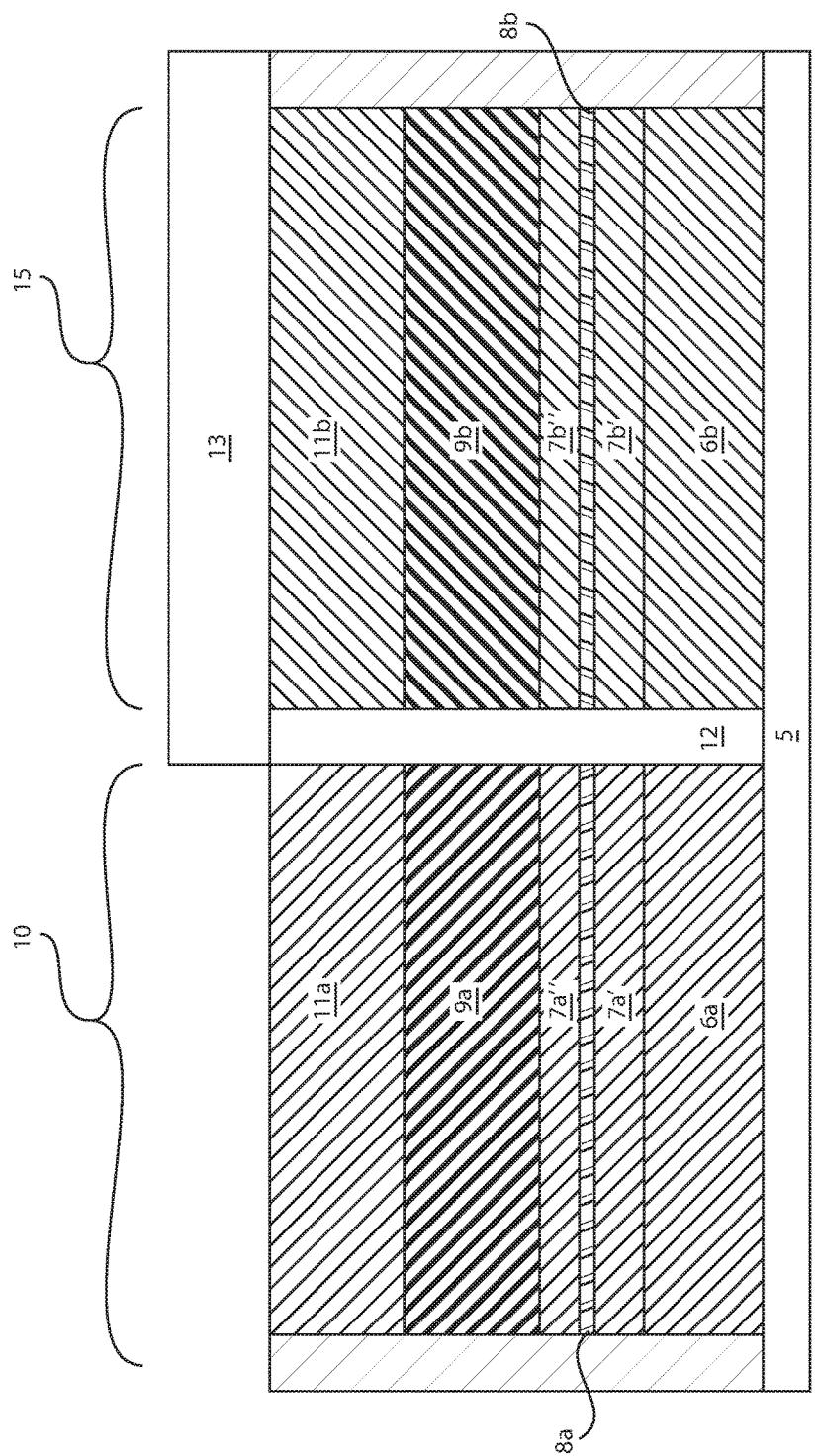
FIG. 1 is a side cross-sectional view of two device material stacks formed overlying a semiconductor substrate that can be employed in one embodiment of the present disclosure, wherein a source/drain region of the device material stacks includes a semiconductor etch stop layer present therein, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. The source and drain regions of the fin structure are the portions of the fin structure that are on opposing sides of the channel region of the fin structure.

A finFET semiconductor device has the drain, fin channel, and source device components arranged perpendicular to the plane of the substrate surface, which is referred to as a vertical stack (also referred to as vertical FinFET). In some embodiments, the methods and structures disclosed herein apply to vertical FinFETs, which are also referred to as a vertically stacked FinFET. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

In some embodiments, the methods and structures disclosed herein can provide a method for controlling the junction placement in vertical field effect transistor (VFET) and vertical tunnel junctions. In some embodiments, the methods and structures disclosed herein provide for precise placement of the junction by employing an etch stop layer of a semiconductor material that is positioned in an n-type or p-type doped region of the device, e.g., p-type or n-type source and/or drain region.

In typical vertical MOSFET (VFET) device processing, the source and drain junctions are typically not self-aligned to the gate-electrode by self-aligned spacers as in the case of lateral geometries. Source-side junction placement can be determined by the vertical fin etch, which can depend on fin-pitch walking, and the remaining spacer thickness following the spacer forming method sequence that can include spacer deposition and etch processes. It has been determined that in view of the above that process variability in junction overlap could introduce a significant device performance variability. For example, if the junction is too much underlapped, source-side resistance (Rs) will become too high (Reff degrade). For example, if the junction is too much overlapped, parasitic capacitance (Cov) will become too high (Ceff degrade). As will be described in further detail below, it has been determined that in some embodiments the above deficiencies in a vertical field effect transistor (VFET) flow can be overcome by the application of a thin etch-stop layer inside the source region of the device. In some embodiments, the thin etch-stop layer may be formed during the active region epitaxial growth, and can include semiconductor material such that the vertical channel etch can be naturally stopped at that layer facilitating the precise control of the gate electrode to the source-junction alignment.

Similar difficulties have been detected in tunnel semiconductor devices, e.g., vertically orientated tunnel semiconductor devices. The term "tunnel" when describing semiconductor devices means that the source and drains of the device have an opposite conductivity type, and the device current is controlled by quantum mechanical tunneling of electrons at the source-channel junction. For example, the source region of the tunnel device is doped to an n-type conductivity, the drain region of the tunnel device is doped to a p-type conductivity; or if the source region of the tunnel device is doped to a p-type conductivity, the drain region of the tunnel device is doped to an n-type conductivity. The opposite conductivity types for the source and drain regions may be referred to as asymmetrical devices. In a tunnel field effect transistors (tunnel FET), on-current sensitively depends on gate and source-channel junction alignment. If the junction is too underlapped, gate-field cannot modulate the tunneling junction located at the source-channel junction. If the junction is too overlapped, gate-field can deplete the source, and lead to ion degradation.

As will be described in further detail below, it has been determined that in some embodiments, the above deficiencies in a vertical tunnel FET (VFET) devices can be overcome by a process flow that introduces a thin etch-stop layer inside the source semiconductor material, such that the vertical channel etch can be naturally stopped at that layer. The thin etch-stop layer may be formed during the active region epitaxial growth for the source region and/or drain region of the vertical tunnel FET, which facilitates the precise control of the gate electrode to the source-to-channel junction alignment.

FIG. 1 depicts one embodiment of two device material stacks 10, 15 formed overlying a semiconductor substrate 5 that can be employed in one embodiment of the present disclosure. The material stacks depicted in FIG. 1 can be employed to provide a semiconductor device, e.g., vertical FinFET or vertical tunnel FET, in which at least one of the source and drain regions of the device includes a semiconductor etch stop layer 8a, 8b present therein. In some embodiments, the material stacks 10, 15 include multiple semiconductor material layers that are doped to provide different conductivity type devices. For example, the first material stack 10 may be processed to provide n-type vertical FinFETs, i.e., FinFETs with n-type source and drain regions, and the second material stack 15 may be processed to provide p-type vertical FinFETs, i.e., FinFETs with p-type source and drain regions. In the embodiments, in which the first and second material stacks 10 are processed to provide vertical tunnel field effect transistors; the first material stack 10 may include a p-type source region and a n-type drain region; and the second material stack 15 may include an n-type source region and a p-type drain region.

In some embodiments, each material stack 10, 15 may include a strain relaxed buffer layer 6a, 6b, a material layer for a source region 7a', 7a", 7n', 7b", a semiconductor etch stop layer 8a, 8b, a material layer for a channel region 9a, 9b, and a material layer for a drain region 11a, 11b.

In some embodiments, in which the first material stack 10 is used for forming an n-type vertical FinFET, the first material stack 10 may be composed of a material layer for the source region 7a', 7a" that is composed of indium gallium arsenic (InGaAs) that is n-type doped; the semiconductor etch stop layer 8a is composed of indium phosphide (InP); the material layer for the channel region 9a is composed of intrinsic, i.e., not externally doped, or lightly p-type doped indium gallium arsenic (InGaAs); and the material layer for the drain region 11a may be composed of indium gallium arsenic (InGaAs) that is n-type doped. On the same supporting substrate 5 that the n-type vertical FinFET is formed, in which the second material stack 15 is used for forming a p-type vertical FinFET, the second material stack 15 may be composed of a material layer for the source region 7b', 7b" that is composed of silicon germanium (SiGe) that is p-type doped; the semiconductor etch stop layer 8b is composed of silicon (Si); the material layer for the channel region 9b is composed of intrinsic, i.e., not externally doped, or lightly n-type doped silicon germanium (SiGe); and the material layer for the drain region 11b may be composed of silicon germanium (SiGe) that is p-type doped.

In another embodiment, in which the first material stack 10 is used for forming a vertical tunnel FET, the first material stack 10 may be composed of a material layer for the source region 7a', 7a" that is composed of gallium antimonide (GaSb) that is p-type doped; the semiconductor etch stop layer 8a is composed of indium phosphide (InP); the material layer for the channel region 9a is composed of intrinsic, i.e., not externally doped, or lightly p-type doped indium arsenic (InAs); and the material layer for the drain region 11a may be composed of indium arsenic (InAs) that is n-type doped. On the same supporting substrate 5, in which the second material stack 15 is used for forming an opposite conductivity vertical tunnel FET as the device formed using the first material stack 10, the second material stack 15 may be composed of a material layer for the source region 7b', 7b" that is composed of indium arsenic (InAs) that is n-type doped; the semiconductor etch stop layer 8b is composed of indium phosphide (InP); the material layer for the channel region 9b is composed of intrinsic, i.e., not externally doped, or lightly n-type doped gallium antimonide (GaSb); and the material layer for the drain region 11b may be composed of gallium antimonide (GaSb) that is p-type doped.

It is noted that the above examples for the first and second material stacks 10, 15 for vertical FinFETs and vertical tunnel FETs are provided for illustrative purposes only. It is not intended that the present disclosure be limited to only these examples. For example, other compositions suitable for the different material layers for the first and second material stacks 10, 15 have been provided below.

The first material stack 10 may be separated from the second material stack 15 by an isolation region 12, e.g., an isolation region 12 composed of an oxide, nitride or oxynitride dielectric composition. In some embodiments, the first and second material stacks 10, 15 may be formed atop a supporting substrate 5. The supporting substrate 5 may be composed of a semiconductor material. In some embodiments, the semiconductor material of the supporting substrate 5 may be primarily (i.e., with doping) of a single element, for example, silicon (Si) or germanium, (Ge), or the supporting substrate 5 may be a compound, for example, GaAs, InP, SiC, or SiGe. In some embodiments, the supporting substrate 5 is composed of a type IV semiconductor material. In some embodiments, the supporting substrate 5 is composed of a type III-V semiconductor material. By "type IV semiconductor" it is meant that the semiconductor material includes at least one element from Group IVA (i.e., Group 14) of the Periodic Table of Elements. Examples of type IV semiconductor materials that are suitable for the supporting substrate 5 include silicon (Si), germanium (Ge), silicon germanium (SiGe), silicon doped with carbon (Si:C), silicon germanium doped with carbon (SiGe:C) and a combination thereof. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the supporting substrate 5 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The supporting substrate 5 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). In an embodiment, the supporting substrate 5 is a single crystal silicon wafer.

The first and second material stacks 10, 15 may then be formed atop the supporting substrate 5 using deposition processes, such as epitaxial deposition. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD). Block masks may be used to independently process the regions of the supporting substrate, in which the first and second material stacks 10, 15 are formed so that different compositions and different conductivity type dopants may be introduced to the first and second material stacks 10, 15. The block masks may include photoresist masks.

Referring to FIG. 1, a strain relaxed buffer layer 6a, 6b may be present directly on the supporting substrate 5 in each of the first material stack 10 and the second material stack 15. The term "relaxed" denotes a semiconductor material layer that does not have an internal strain, in which the lattice dimension in the direction parallel to the channel plane (x-direction), perpendicular to the channel plane (y-direction) and out of the channel plane (z-direction) are the same. In some embodiments, a strain relaxed buffer (SRB) layer 6a, 6b that is substantially relaxed has a strain no greater than about +/−0.1 GPa tensile or compressive. In one example, the strain relaxed buffer (SRB) layer 6a, 6b may be completely relaxed.

In one embodiment, the strain relaxed buffer (SRB) layer 6a, 6b may be composed of one or multiple layers of type IV or type III-V semiconductor material depending upon the composition of the supporting substrate and the later formed material layers for the source region. The compositions of the different material layer in the strain relaxed buffer (SRB) layer 6a, 6b may be selected in order to relax strain. For example, the compositions of multiple layers in the strained relaxed buffer (SRB) layer may be selected to have gradually reducing or gradually increasing lattice dimensions to between the supporting substrate 5 and the subsequently formed material layers for the source regions 7a, 7b of the device being provided by the first and second material stacks 10, 15. The thickness for the material layers within the different material layers of the strain relaxed buffer layer may also be selected to relax strain. For example, the thickness of the SRB layer 6a, 6b may be on the order of a micron.

In some embodiments, the relaxed semiconductor layer may be composed of type III-V materials having a lattice dimension between the lattice dimension of silicon (Si), as used in the supporting substrate 5, and the lattice dimension of gallium antimonide (GaSb), as used in the material layer for the source region 7a, 7b of the devices being provided by the first and second material stacks 10, 15. In some embodiments, the relaxed semiconductor layer may be composed of silicon germanium (SiGe) having a low germanium content (Ge). For example, the relaxed semiconductor layer 6a, 6b may be composed of silicon germanium (SiGe), in which the germanium (Ge) content is 25% or less, or may be composed of a multilayered structure in which the upper surface of the multilayered structure has a germanium (Ge) content of 25% or less. In another example, the strain relaxed buffer (SRB) layer 10 may be composed of multilayers of silicon (Si), silicon germanium (SiGe), and silicon germanium doped with carbon (SiGe:C). It is noted that the above examples are provided for illustrative purposes only, and are not intended to limit the present disclosure, as any semiconductor material may be suitable for the strain relaxed buffer (SRB) layer 6a, 6b. In some embodiments, the strain relaxed buffer (SRB) layer 6a, 6b may be formed directly on the supporting substrate 5 using a deposition process, such as epitaxial deposition.

Still referring to FIG. 1, following formation of the strain relaxed buffer layer 6a, 6b, the material layer for the source region of the semiconductor device, e.g., vertical FinFET and/or vertical tunnel FET, may be deposited. More specifically, the first portion of the material layer for the source region 7a', 7b' may be epitaxially formed on the strain relaxed buffer (SRB) layer 6a, 6b. The first portion of the material layer 7a', 7b' may be composed of a type IV semiconductor material or a type III-V semiconductor material. Any of the aforementioned type III-V and type IV semiconductor materials that have been described for the supporting substrate are also suitable for the source region 7a', 7b'.

Epitaxial growth processed can be used for growing the first portion of the material layer for the source region 7a', 7b' directly on the strain relaxed buffer layer 6a, 6b. A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. Silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane ($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. Germanium gas source for epitaxial deposition may be selected from the group consisting of germane ($GeH_4$), digermane ($Ge_2H_6$), halogermane, dichlorogermane, trichlorogermane, tetrachlorogermane and combinations thereof.

The first portion of the material layer for the source region 7a', 7b' may be in-situ doped. For example, the first portion of the material layer for the source region 7a', 7b' may be doped with an n-type or p-type dopant. As used herein, "p-type" refers to the addition of impurities to an intrinsic semiconductor that creates deficiencies of valence electrons. As used herein, "n-type" refers to the addition of impurities that contributes free electrons to an intrinsic semiconductor. In some embodiments, the dopant that dictates the conductivity type of the first portion of the material layer for the source region 7a', 7b' is introduced in-situ. By "in-situ" it is meant that the dopant that dictates the conductivity type of the first portion of the material layer for the source region 7a', 7b' is introduced during the process step, e.g., epitaxial deposition. Alternatively, the dopant that provides the conductivity type of the first portion of the material layer for the source region 7a', 7b' is introduced by ion implantation. In a type IV semiconductor material, such as silicon and germanium, examples of p-type dopants, i.e., impurities, include but are not limited to: boron, aluminum, gallium and indium. In a type IV semiconductor material, such as silicon or germanium, examples of n-type dopants, i.e., impurities, include but are not limited to antimony, arsenic and phosphorous. In type III-V semiconductor materials, the effect of the dopant atom, i.e., whether it is a p-type or n-type dopant, depends occupied by the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. The dopant for the epitaxial semiconductor material that dictates the conductivity type of the source and drain regions 40a, 40b, 45a, 45b is typically present in a concentration ranging from $1E^{17}$ atoms/cm$^3$ to $5E^{20}$ atoms/cm$^3$.

The thickness of the first portion of the material layer for the source region 7a', 7b', as well as the thickness of the later formed second portion of the material layer for the source region 7a", 7b" dictates the positioning of the semiconductor etch stop layer 8a, 8b, and the amount of overlap that the source region will have with the gate structure. This is referred to as the junction overlap, i.e., how much the extension portion of the source region extends past the inner sidewall of the gate sidewall spacer into the channel region that the gate structure is overlying. In vertical FinFET devices, if the junction is too underlapped, i.e., the extension of the source region does not extend far enough in the direction of the channel, the source-side resistance (Rs) will become too high (Reff degrade). In vertical FinFET devices, if the junction is too much overlapped, i.e., the extension of the source region extends too far in the direction of the channel, parasitic capacitance (Cov) will become too high (Ceff degrade). In a tunnel field effect transistors (tunnel FET), on-current sensitively depends on gate and source-channel junction alignment. If the junction is too underlapped, gate-field cannot modulate the tunneling junction. If the junction is too overlapped, gate-field can deplete the source, and lead to ion degradation. In some embodiments, the thickness of the first portion of the material layer for the source region 7a', 7b' may range from 5 nm to 100 nm. In other embodiments, the thickness of the first portion of the material layer for the source region 7a', 7b' may range from 15 nm to 25 nm.

Following the formation of the first portion of the material layer for the source region 7a', 7b', the semiconductor etch stop layer 8a, 8b may be formed. In some embodiments, the semiconductor etch stop layer 8a, 8b is epitaxially grown directly on the upper surface of the first portion of the material layer for the source region 7a', 7b'. The composition of the semiconductor etch stop layer 8a, 8b is selected so that the subsequently formed second portion of the material layer for the source region 7a", 7b" can be etched selectively to the semiconductor etch stop layer 8a, 8b. The term "selective" as used to describe a material removal process denotes that the rate of material removal for a first material is greater than the rate of removal for at least another material of the structure to which the material removal process is being applied. For example, the subsequently formed second portion of the material layer for the source region 7a", 7b" can be etched selectively to the semiconductor etch stop layer 8a, 8b at a rate greater than 50:1, e.g., about 100:1. For example, when the source region is composed of a III-V semiconductor material, such as gallium antimony (GaSb) or indium gallium arsenide (InGaAs), the etch stop layer 8a, 8b may be composed of an indium and phosphorus alloy, such as indium phosphide (InP). In other examples, when the source region is composed of a type IV semiconductor material, such as silicon germanium (SiGe), the etch stop layer 8a, 8b may be composed of a silicon (Si).

The semiconductor etch stop layer 8a, 8b may be formed using epitaxial deposition similar to the epitaxial deposition process described above for forming the first portion of the material layer for the source region 7a', 7b'. Therefore, the above description of the epitaxial deposition process for forming the first portion of the material layer for the source region 7a', 7b' is suitable for describing forming the semiconductor etch stop layer 8a, 8b. The thickness of the semiconductor etch stop layer 8a, 8b is selected to ensure that enough material is present to stop the etch process that etches the second portion of the material layer for the source region 7a", 7b" from etching into the first portion of the material layer for the source region 7a', 7b'. In some embodiments, the thickness of the semiconductor etch stop layer 8a, 8b may range from 2 nm to 30 nm. In other embodiments, the thickness of the semiconductor etch stop layer 8a, 8b may range from 2 nm to 5 nm. The semiconductor etch stop layer 8a, 8b may have a conductivity type that is equal to the first portion of the material layer for the source region 7a', 7b'. For example, if the first portion of the material layer for the source region 7a', 7b' is doped to an n-type conductivity, the semiconductor etch stop layer 8a, 8b may also be doped to an n-type conductivity, e.g., by in situ doping and/or ion implantation. In other embodiments, the semiconductor etch stop layer 8a, 8b may be composed of an intrinsic semiconductor material, i.e., the semiconductor etch stop layer 8a, 8b is not in situ doped or doped by ion implantation with n-type or p-type dopants extrinsic to the base composition.

Still referring to FIG. 1, forming the source region of the device may continue with forming the second portion of the material layer for the source region 7a", 7b". The thickness of the second portion of the material layer for the source region 7a", 7b" may dictate the degree of overlap of the source region with the subsequently formed gate structure. The second portion of the material layer for the source region 7a", 7b" may be epitaxially formed on the semiconductor etch stop layer 8a, 8b. The second portion of the material layer for the source region 7a", 7b" may be composed of a type IV semiconductor material or a type III-V semiconductor material. The second portion of the material layer for the source region 7a", 7b" may have the same base composition or different base composition as the first portion of the material layer for the source region 7a', 7b'. For example, if the first portion of the material layer for the source region 7a', 7b' is composed of indium gallium arsenide (InGaAs), the second portion of the source region 7a", 7b" is composed of indium gallium arsenide (InGaAs). In another example, if the first portion of the material layer for the source region 7a', 7b' is composed of gallium antimony (GaSb), the second portion of the source region 7a", 7b" is composed of gallium antimony (GaSb). It is noted that other compositions may also be suitable for the second portion of the material layer for the source region 7a", 7b". Any of the aforementioned type III-V and type IV semiconductor materials that have been described for the supporting substrate are also suitable for the second portion of the material layer for the source region 7a", 7b".

Epitaxial growth processed can be used for growing the second portion of the material layer for the source region 7a", 7b" directly on the semiconductor etch stop layer 8a, 8b. The second portion of the material layer for the source region 7a", 7b" may be formed using epitaxial deposition similar to the epitaxial deposition process described above for forming the first portion of the material layer for the source region 7a', 7b'. Therefore, the above description of the epitaxial deposition process for forming the first portion of the material layer for the source region 7a', 7b' is suitable for describing forming the second portion of the material layer for the source region 7a", 7b". The thickness of the semiconductor etch stop layer 8a, 8b is the portion of the source region that dictates the positioning of the junction with respect to the exterior sidewall of the subsequently formed gate structure, and therefore dictates junction overlap. In vertical FinFET devices, if the junction is too underlapped, i.e., the extension of the source region does not extend far enough in the direction of the channel, the source-side resistance (Rs) will become too high (Reff degrade); and if the junction is too much overlapped, i.e., the extension of the source region extends too far in the direction of the channel, parasitic capacitance (Cov) will become too high (Ceff degrade). In a tunnel field effect transistors (tunnel FET), if the junction is too underlapped, gate-field cannot modulate the tunneling junction; and if the junction is too overlapped, gate-field can deplete the source, and lead to ion degradation. In some embodiments, the thickness of the second portion of the material layer for the source region 7a", 7b" may range from 5 nm to 30 nm. In other embodiments, the thickness of the second portion of the material layer for the source region 7a", 7b" may range from 5 nm to 10 nm.

Still referring to FIG. 1, following formation of the material layers for the source region, the material layer for the channel region 9a, 9b is formed. The material layer for the channel region 9a, 9b is composed of an intrinsic, i.e., not externally doped, semiconductor material. Or, it can be lightly doped with appropriate doping type. The material layer for the channel region 9a, 9b may be composed of a type IV semiconductor material, or a type III-V semiconductor material. In some examples, the material layer for the channel region 9a, 9b is composed of intrinsic, i.e., not externally doped, gallium antimonide (GaSb) or indium gallium arsenic. It is noted that the above examples are provided for illustrative purposes only, and that other type IV and type III-V semiconductor materials are equally applicable. The material layer for the channel region 9a, 9b may be formed using epitaxial deposition similar to the epitaxial deposition process described above for forming the first portion of the material layer for the source region 7a', 7b'. Therefore, the above description of the epitaxial deposition process for forming the first portion of the material layer for the source region 7a', 7b' is suitable for describing forming the material layer for the channel region 9a, 9b. The thickness of the material layer for the channel region 9a, 9b is selected to provide the length of the channel, i.e., the dimension separating the source region from the drain region. In some embodiments, the thickness of the material layer for the channel region 9a, 9b may range from 5 nm to 100 nm. In other embodiments, the thickness of the material layer for the channel region 9a, 9b may range from 10 nm to 25 nm.

Following formation of the material layers for the channel region 9a, 9b, the material layer for the drain region 11a, 11b is formed. The material layer for the drain region 11a, 11b is composed of an n-type or p-type semiconductor material, e.g., a type IV semiconductor material or type III-V semiconductor material. The base composition of the material layer for the drain region 11a, 11b may be the same as the base composition for the material layer of the channel region 9a, 9b. For example, when the channel region 9a, 9b is composed of indium arsenic (InAs), the material layer for the drain region 11a, 11b may also be composed of indium arsenic (InAs). In another example, when the channel region 9a, 9b is composed of silicon germanium (SiGe), the material layer for the drain region 11a, 11b may also be composed of silicon germanium (SiGe). In yet another example, when the channel region 9a, 9b is composed of indium gallium arsenic (InGaAs), the material layer for the drain region 11a, 11b may also be composed of indium gallium arsenic (InGaAs). It is noted that the above examples are provided for illustrative purposes only, and that other type IV and type III-V semiconductor materials are equally applicable.

The conductivity type of the material layer for the material layer for the drain region 11a, 11b, i.e., n-type or p-type conductivity, is selected based upon the type of semiconductor device is being formed in the first and second material stacks 10, 15. In some embodiments, when the semiconductor device being formed in the first and second material stacks 10, 15 is a vertical FinFET, the conductivity type of the material layer for the drain region 11a, 11b is the same as the conductivity type of the material layers for the source region 7a', 7b', 7a", 7b". For example, if the material layers for the source region 7a', 7b', 7a", 7b" are doped to an n-type conductivity in one of the first and second material stacks 10, 15, the material layer for the drain region 11a, 11b in that same material stack will also be n-type. In some embodiments, when the semiconductor device being formed in the first and second material stacks 10, 15 is a vertical tunnel FET, the conductivity type of the material layer for the drain region 11a, 11b will have the opposite conductivity type as the conductivity type of the material layers for the source region 7a', 7b', 7a", 7b". For example, if the material layers for the source region 7a', 7b', 7a", 7b" are doped to an n-type conductivity in one of the first and second material stacks 10, 15, the material layer for the drain region 11a, 11b in that same material stack will be p-type.

The material layer for the drain region 11a, 11b may be formed using epitaxial deposition similar to the epitaxial deposition process described above for forming the first portion of the material layer for the source region 7a', 7b'. Therefore, the above description of the epitaxial deposition process for forming the first portion of the material layer for the source region 7a', 7b' is suitable for describing forming the material layer for the drain region 11a, 11b. The material layer for the drain region 11a, 11b may be doped in situ, by ion implantation or by a combination thereof. In some embodiments, the thickness of the material layer for the drain region 11a, 11b may range from 10 nm to 100 nm. In other embodiments, the thickness of the material layer for the drain region 11a, 11b may range from 10 nm to 25 nm.

The isolation regions 12 may be formed by etching trenches through the material layers of the first and second material stacks 10, 15, and by depositing dielectric material in the trenches, using a deposition process, such as chemical vapor deposition.

Figure 2:
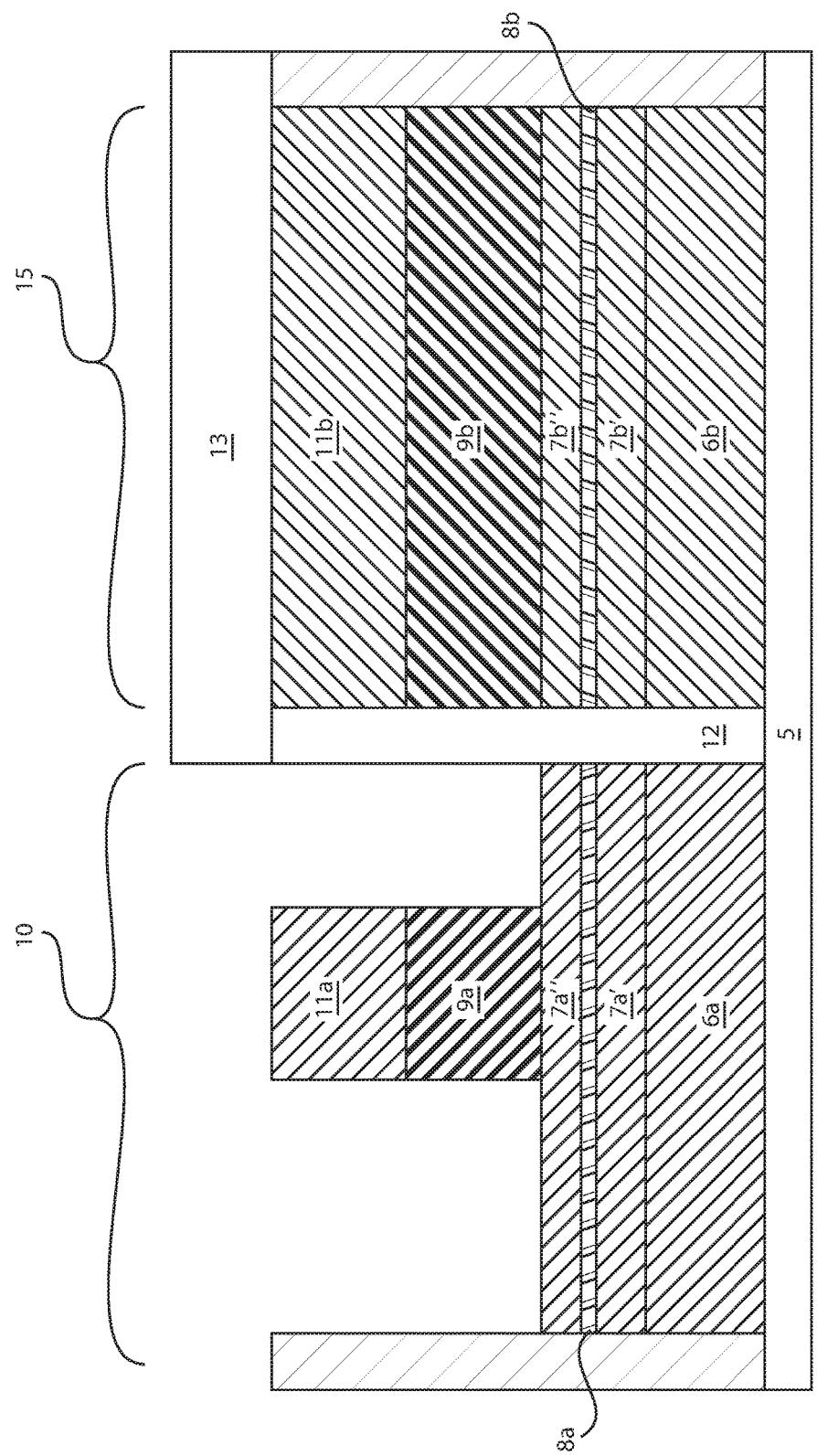
FIG. 2 is a side cross-sectional view depicting forming a block mask over a second of the two device material stacks and etching the first of the two device material stacks to form at least the channel region of a vertically orientated semiconductor device.

FIG. 2 depicts forming a first block mask 13 over the second material stack 15 and etching through the material layers for the drain region 11a and channel region 9a of the first material stack 10, which forms at least the channel region of a vertically orientated semiconductor device, e.g., vertical FinFET or vertical tunnel FET. The first block mask 13 may be composed of a photoresist material. More specifically, in some embodiments, forming the first block mask 13 may begin with depositing a layer of photoresist atop the entire structure depicted in FIG. 1. The photoresist layer is then selectively exposed to light and developed to pattern a block mask protecting the second material stack 15, and exposing at least a portion of the first material stack 10 that is to be etched. The exposed regions of the first material stack 10 are then etched while the regions underlying the block mask, i.e., the second material stack 15, are protected. In some embodiments, a portion of the first block mask 13 is also present over the portion of the first material stack 10 that provides the drain region 11a and channel region 9a of the semiconductor device being formed from the first material stack 10. In other embodiments, after forming the first block mask 13, an etch mask (not shown) separate from the first block mask 13 is formed over the first material stack 10 that provides the drain region 11a and channel region 9a.

In a following process step, the exposed portions of the first material stack 10 are etched to define the channel region 9a and the drain region 11a. The etch process may be an anisotropic etch, such as reactive ion etch (RIE), laser etching or plasma etching. In one embodiment, when the material layer for the drain region 11a and the material layer for the channel region 9a have substantially the same composition, a first etch may etch through these layers selectively to the second portion of the material layer for the source region 7a".

Figure 3:
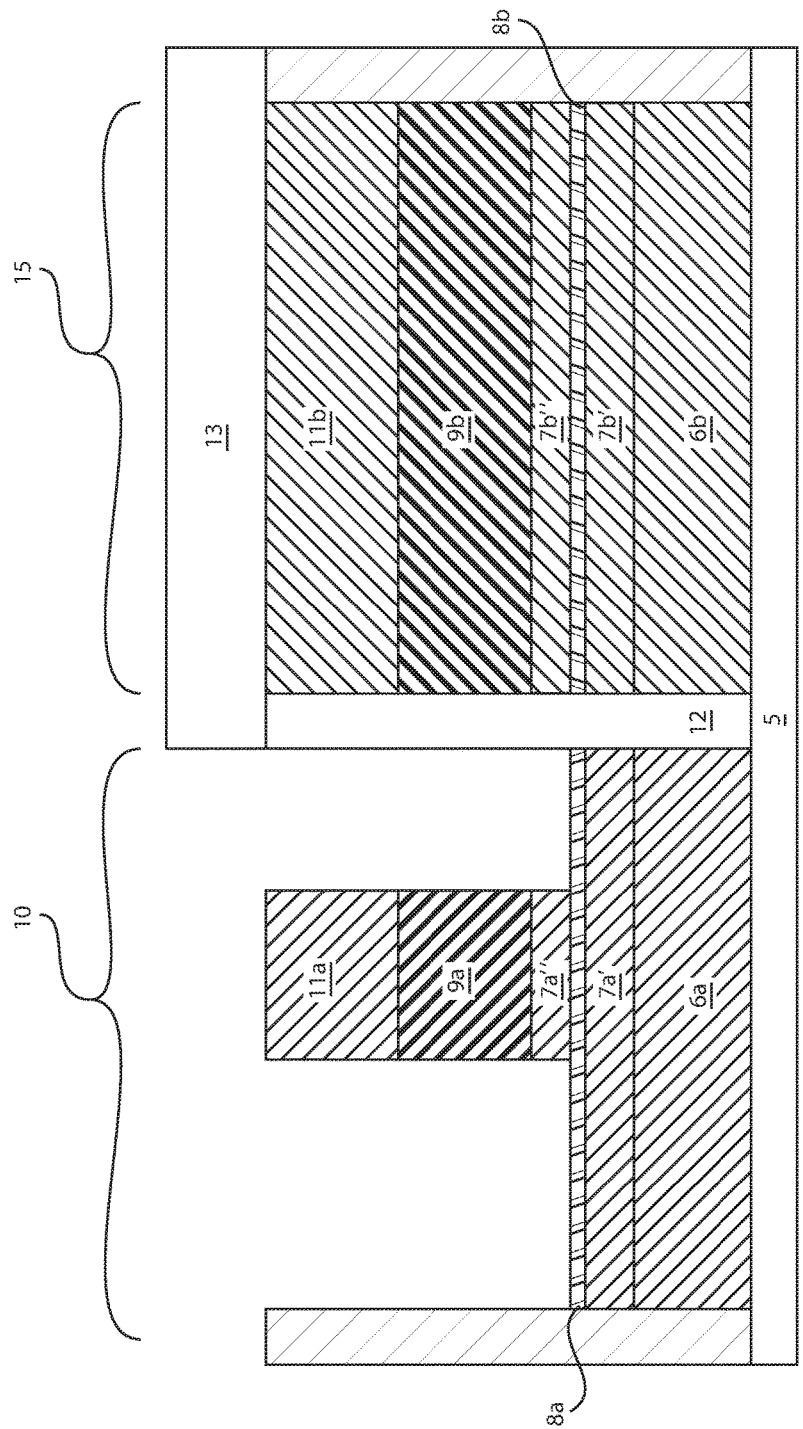
FIG. 3 is a side cross-sectional view depicting one embodiment of etching the source/drain region including the semiconductor etch stop layer in the first material stack, wherein the etch is selective to the semiconductor etch stop layer and the depth of the semiconductor etch stop layer dictates junction alignment for the semiconductor device formed from the first material stack.

FIG. 3 depicts one embodiment of etching the second portion of the material layer for the source region 7a" with an etch that is selective to the underlying semiconductor etch stop layer 8a. Similar to the etch process described with reference to FIG. 2, at this stage of the process flow the first block mask 13 is still present overlying the second material stack 15. In some embodiments, a photoresist mask may also be present atop the drain region 11a. In other embodiments, the etch process for etching the second portion of the material layer for the source region 7a" is selective to the underlying semiconductor etch stop layer 8a, as well as the drain region 11a. The second portion of the material layer for the source region 7a" that remains following this etch step provides a source region extension that dictates the junction overlap, i.e., the degree by which the extension of the source region extends beyond the inside sidewall of the gate sidewall spacer towards the channel region of the device. The depth of the semiconductor etch stop layer 8A dictates junction alignment for the semiconductor device formed from the first material stack 10. The second portion of the material layer for the source region 7a" that remains following the etch step depicted in FIG. 3 has a width that is equal to at least the channel region 9a of the device. In some embodiments, the etched second portion of the material layer for the source region 7a" has a height H1 that is measured from the upper surface of the semiconductor etch stop layer 8a that ranges from 5 nm to 30 nm. In another embodiment, the etched second portion of the material layer for the source region 7a" has a height H1 that is measured from the upper surface of the semiconductor etch stop layer 8a that ranges from 5 nm to 10 nm. Following etching of the second portion of the material layer for the source region 7a", the first block mask 13 may be removed. The first block mask 13 may be removed using chemical stripping or selective etching.

Figure 4:
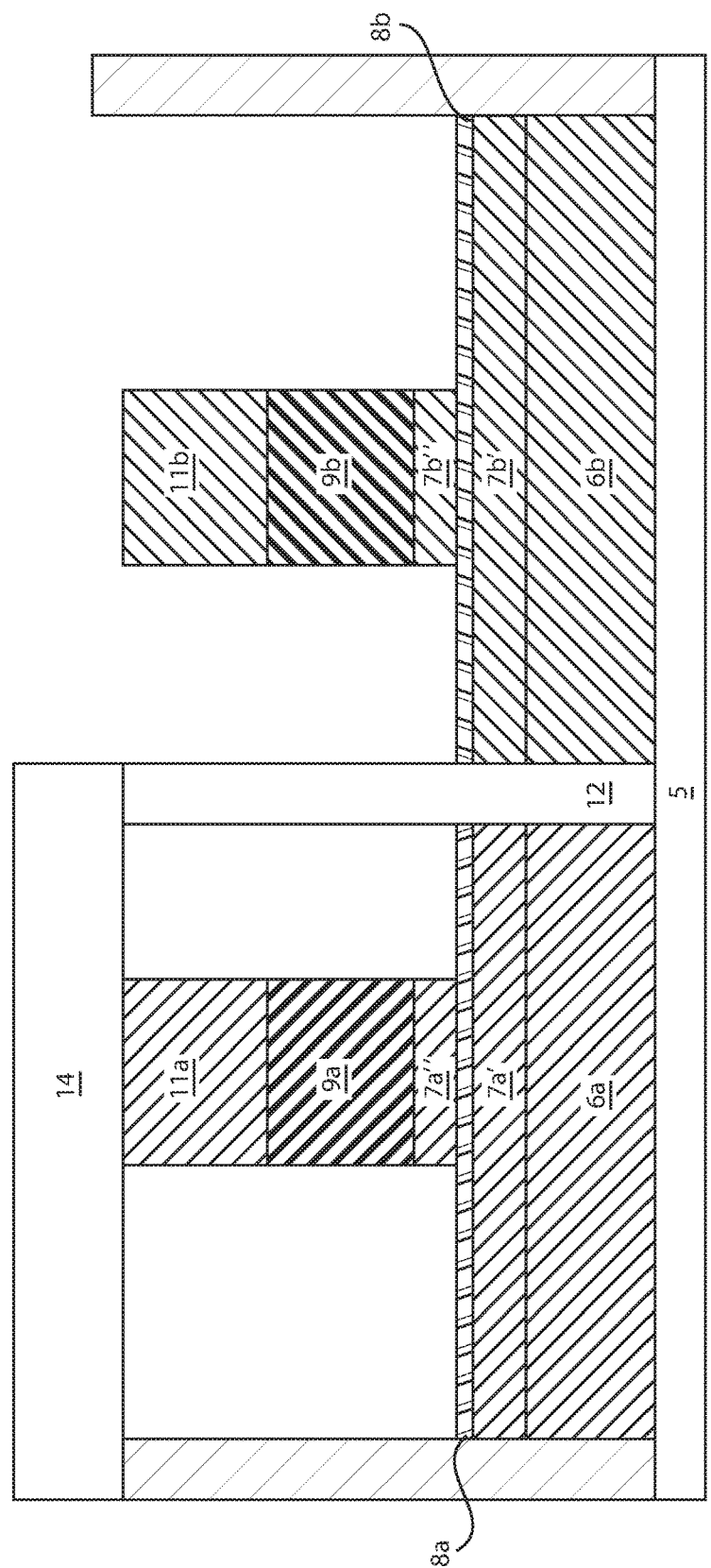
FIG. 4 is a side cross-sectional view depicting one embodiment of forming a block mask over the first material stack and etching the second of the two device material stacks to form a junction including a source region, channel region and drain region, wherein the depth of the semiconductor etch stop layer in the second material stack dictates junction alignment for the semiconductor device formed from the second material stack.

FIG. 4 depicting one embodiment of forming a second block mask 14 over the first material stack 10 that was etched in the process sequence described with reference to FIG. 3, and etching the second material stack 15 to form a junction including a source region 7b',7b", channel region 9b and drain region 11b. Similar to the etching of the first material stack 10 described with reference to FIG. 3, the depth of the semiconductor etch stop layer 8b in the second material stack 15 dictates junction alignment for the semiconductor device formed from the second material stack 15. The second block mask 14 is similar to the first block mask 13 that has been described above with reference to FIG. 3. Therefore, the above description of the first block mask 13 depicted in FIG. 3 is suitable for describing one embodiment of a second block mask, as depicted in FIG. 4. Following formation of the second block mask 14 protecting the previously patterned first material stack 10, the second material stack 15 may be etched to pattern the drain region 11b, the channel region 9b and the source region 7b". The etch process for patterning the second material stack 15 is similar to the etch process for etching the first material stack 10 that has been described with reference to FIGS. 2 and 3.

For example, in some embodiments, a portion of the second block mask 14 is also present over the portion of the second material stack 15 that provides the drain region 11b and channel region 9b of the semiconductor device being formed from the second material stack 15. In other embodiments, after forming the second block mask 14, an etch mask (not shown) separate from the second block mask 14 is formed over the second material stack 15 that provides the drain region 11b and channel region 9b. Thereafter, the exposed portions of the second material stack 15 are etched to define the channel region 9b and the drain region 11b using an anisotropic etch, such as reactive ion etch (RIE), laser etching or plasma etching. In one embodiment, when the material layer for the drain region 11b and the material layer for the channel region 9b have substantially the same composition, a first etch may etch through these layers selectively to the second portion of the material layer for the source region 7b". The method may continue with etching the second portion of the material layer for the source region 7b" with an etch that is selective to the underlying semiconductor etch stop layer 8b. The second portion of the material layer for the source region 7b" that remains following this etch step provides a source region extension that dictates the junction overlap, i.e., the degree by which the extension of the source region extends beyond the inside sidewall of the gate sidewall spacer towards the channel region of the device. The depth of the semiconductor etch stop layer 8b dictates junction alignment for the semiconductor device formed from the second material stack 15. The second portion of the material layer for the source region 7b" that remains following the etch step depicted in FIG. 4 has a width that is equal to at least the channel region 9b of the device. In some embodiments, the etched second portion of the material layer for the source region 7b" has a height H1 that is measured from the upper surface of the semiconductor etch stop layer 8b that ranges from 5 nm to 30 nm. In another embodiment, the etched second portion of the material layer for the source region 7b" has a height that is measured from the upper surface of the semiconductor etch stop layer 8b that ranges from 5 nm to 10 nm. Following etching of the second portion of the material layer for the source region 7b" for the second material stack 15, the second block mask 14 may be removed. The second block mask 14 may be removed using chemical stripping or selective etching.

Figure 5:
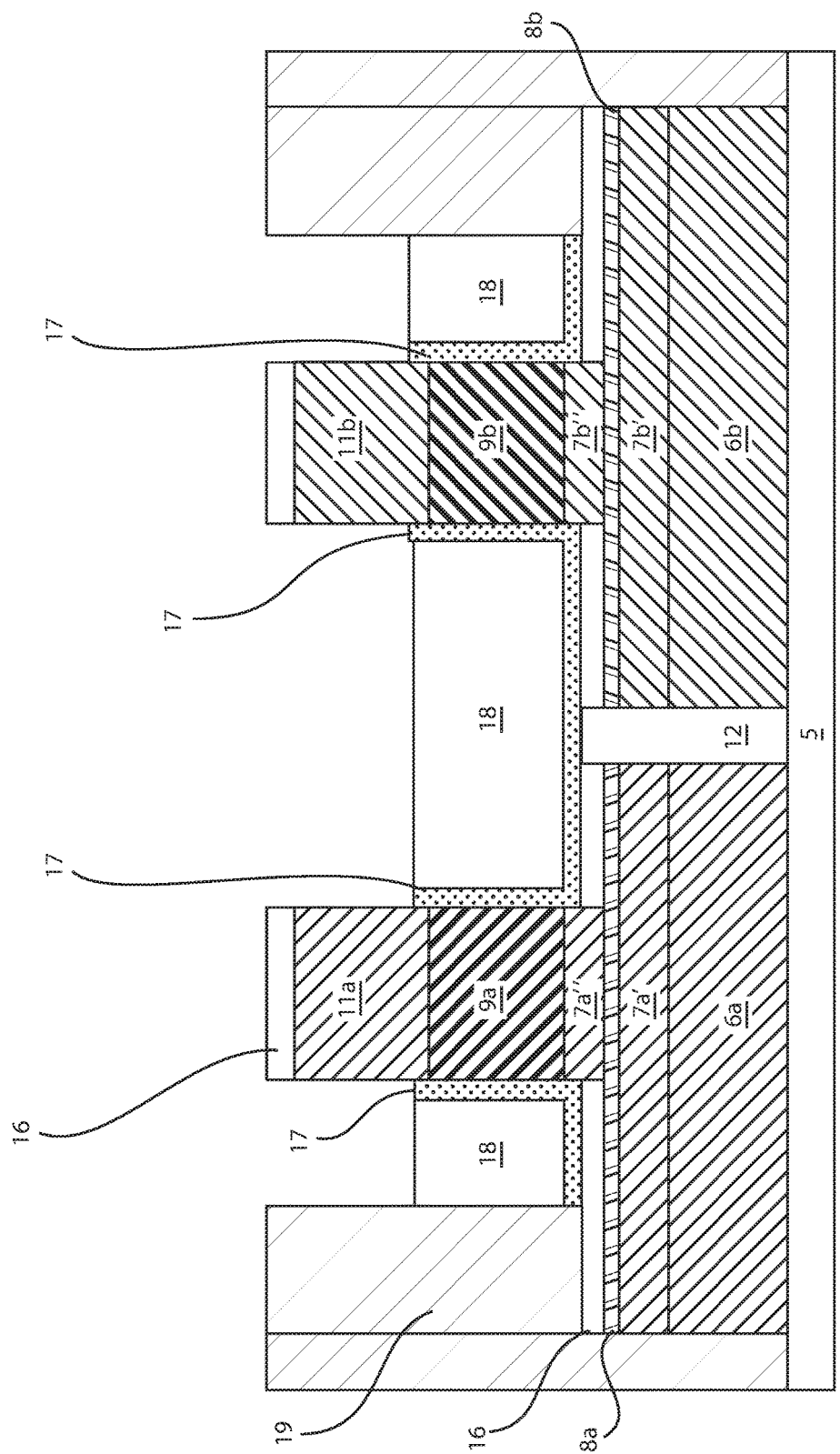
FIG. 5 is a side cross-sectional view depicting forming a first gate sidewall spacer and a gate structure, in accordance with one embodiment of the present disclosure.

FIG. 5 depicts forming a first gate sidewall spacer 16 and a gate structure 17, 18. In some embodiments, the first gate sidewall spacer 16 is composed of a low-k dielectric material. As used herein, the term "low-k" denotes a dielectric material having a dielectric constant equal to the dielectric constant of silicon nitride ($Si_3N4$) or less. The first low-k gate sidewall spacer 16 typically have a dielectric constant that is less than 7.0, e.g., 5.5. In one embodiment, the first low-k dielectric material has a dielectric constant ranging from 3.9 to 6. In another embodiment, the first low-k dielectric material has a dielectric constant less than 3.9. Examples of materials suitable for the first low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The first low-k spacer material may be blanket deposited on the vertically orientated and horizontally orientated surfaces of the source region 7a', 7b', the channel region 9a, 9b, and the drain region 11a, 11b using at least one of spin on deposition, chemical vapor deposition (CVD), plasma-assisted CVD, evaporation and chemical solution deposition. Following the deposition of the first low-k spacer material, the layer of low-k spacer material may be etched to remove the vertically orientated surfaces that are present on the channel region 9a, 9b, wherein the horizontally orientated surfaces of the low-k spacer material may remain on the horizontal surfaces of the source region 7a', 7b' providing the first gate sidewall spacer 16. A horizontally orientated portion of the low-k spacer material may also remain on the upper surface of the drain region 11a, 11b.

Still referring to FIG. 5, a first interlevel dielectric 19 may be formed that determines the height H2 of the gate structure 17, 18, as measured from the sidewall surface of the channel region 9a, 9b. The first interlevel dielectric 19 may be composed of any dielectric material, such as an oxide, nitride or oyxnitride material. For example, the first interlevel dielectric 19 may be composed of silicon oxide. The first interlevel dielectric 19 may be formed using deposition and etch processes.

The gate structure 17, 18 may be formed in the opening between the interlevel dielectric 19 and the first and second material stacks 10, 15 that have been etched to provide the source region 7a', 7a'', 7b', 7b'', the channel region 9a, 9b, and the drain regions 11a, 11b. The gate structure 17, 18 may include at least one gate dielectric 17 and at least one gate electrode 18. The gate dielectric 17 is formed directly on the first gate sidewall spacer 16 and on the sidewalls of the channel region 9a, 9b. Typically, the gate dielectric 17 is formed using a conformal deposition process. The gate dielectric 17 may be composed of any dielectric material, such as an oxide, nitride or oxynitride material. In some embodiments, the gate dielectric 17 is a high-k dielectric material. As used herein, "high-k" denotes a dielectric material featuring a dielectric constant (k) higher than the dielectric constant of $SiO_2$ at room temperature. For example, the gate dielectric layer 17 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 17 include hafnium silicate, hafnium silicon oxynitride or combinations thereof. The gate dielectric 17 may be deposited using atomic layer deposition (ALD). In other embodiments, the gate dielectric 17 may be deposited using chemical vapor deposition methods, such as plasma enhanced chemical vapor deposition (PECVD). In one embodiment, the at least one gate dielectric layer 17 has a thickness ranging from about 1.0 nm to about 6.0 nm.

Following formation of the gate dielectric 17, a work function metal layer of the gate conductor 18 may be deposited. The work function metal may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof. A gate electrode portion of the gate conductor 18 may then be formed on the work function metal layer of the gate conductor 18. In various embodiments, the gate electrode is a metal, where the metal may be tungsten (W), tungsten nitride (WN) or combinations thereof. In one or more embodiments, the gate electrode 18 is tungsten (W). The gate electrode may be deposited by CVD, e.g., plasma enhanced chemical vapor deposition (PECVD).

The material layers for the gate conductor 18 may be deposited using physical vapor deposition, such as plating, electroplating, electroless deposition, sputtering and combinations thereof. Following deposition of the material layers for the gate conductor 18, the material layers for the gate dielectric 17 and the gate conductor 18 may be etched to provide the proper height of the gate structure 17, 18, consistent with the channel region 9a, 9b for each of the material stacks 15, 20.

Figure 6:
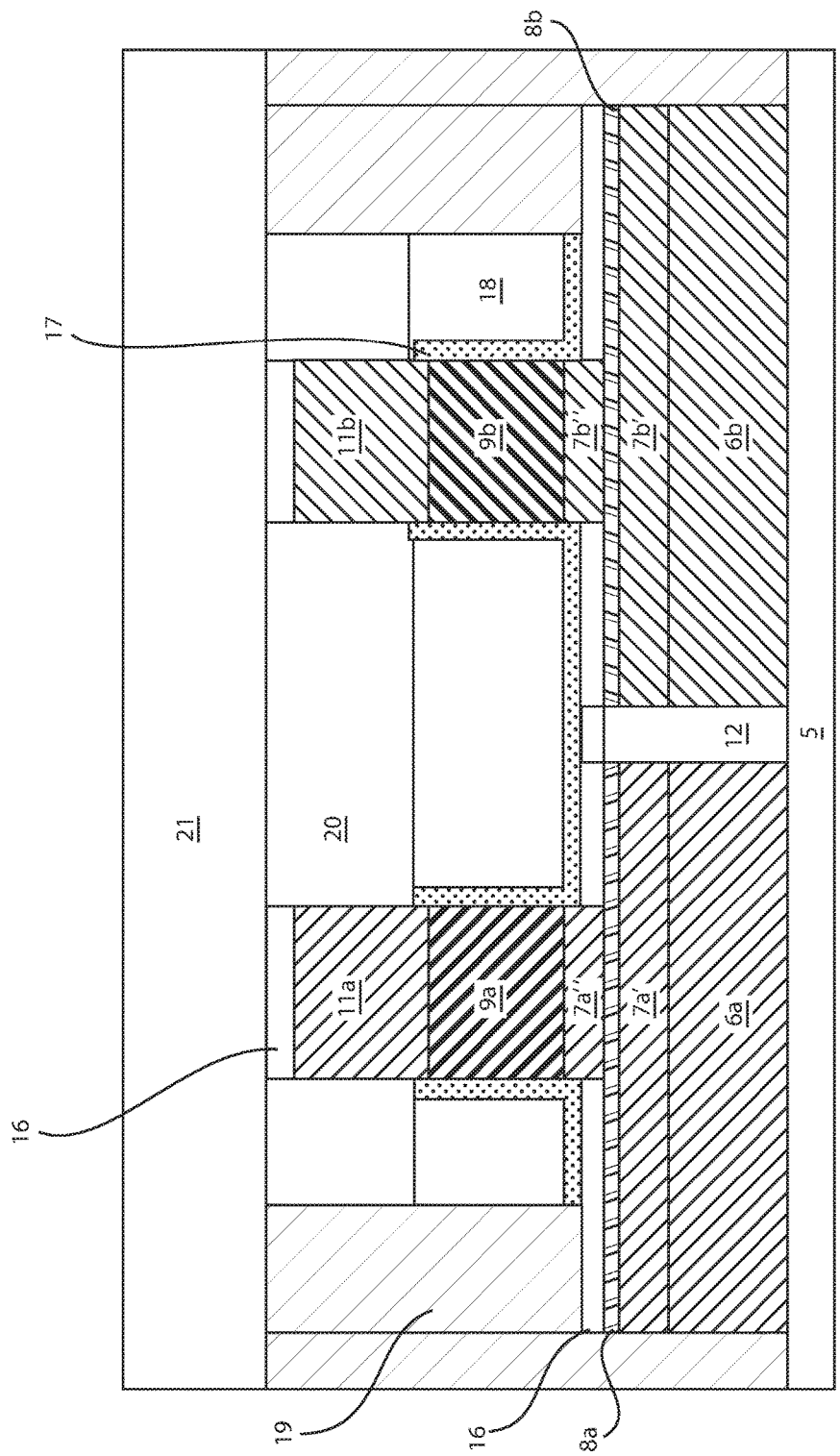
FIG. 6 is a side cross-sectional view depicting forming a second gate sidewall spacer and an interlevel dielectric layer, in accordance with one embodiment of the present disclosure.

FIG. 6 depicts forming a second gate sidewall spacer 20 and a second interlevel dielectric 21 atop the structures depicted in FIG. 5. Similar to the first gate sidewall spacer 16, the second gate sidewall spacer 20 may be composed of a low-k dielectric material. The low-k dielectric material for the second gate sidewall spacer 20 may be composed of a same material as the first low-k spacer 16. Therefore, the above description of the dielectric material for the first low-k gate sidewall spacer 16 is suitable for the description of the composition of the second low-k gate sidewall spacer 20. For example, the second low-k gate sidewall spacer 20 may be an oxide. The second low-k gate sidewall spacer 20 may be deposited using a chemical vapor deposition process, such as plasma enhanced chemical vapor deposition (PECVD). In other examples, the second low-k gate sidewall spacer 20 may be deposited using chemical solution deposition or spin on deposition. The height of the material layer for the second low-k gate sidewall spacer 20 may be reduced by etching, such as reactive ion etching (RIE), which may be aided by the presence of an etch mask, such as a photoresist mask.

In a following process step, a second interlevel dielectric 21 may be deposited and planarized. The second interlevel dielectric 21 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 21 include any of the aforementioned materials in porous form, or in a form that changes during processing to or from being porous and/or permeable to being non-porous and/or non-permeable. The second interlevel dielectric layer 21 may be deposited using chemical vapor deposition, deposition from solution, spin on deposition and combinations thereof. The planarization process applied to the interlevel dielectric 21 following its deposition may be chemical mechanical planarization.

Figure 7:
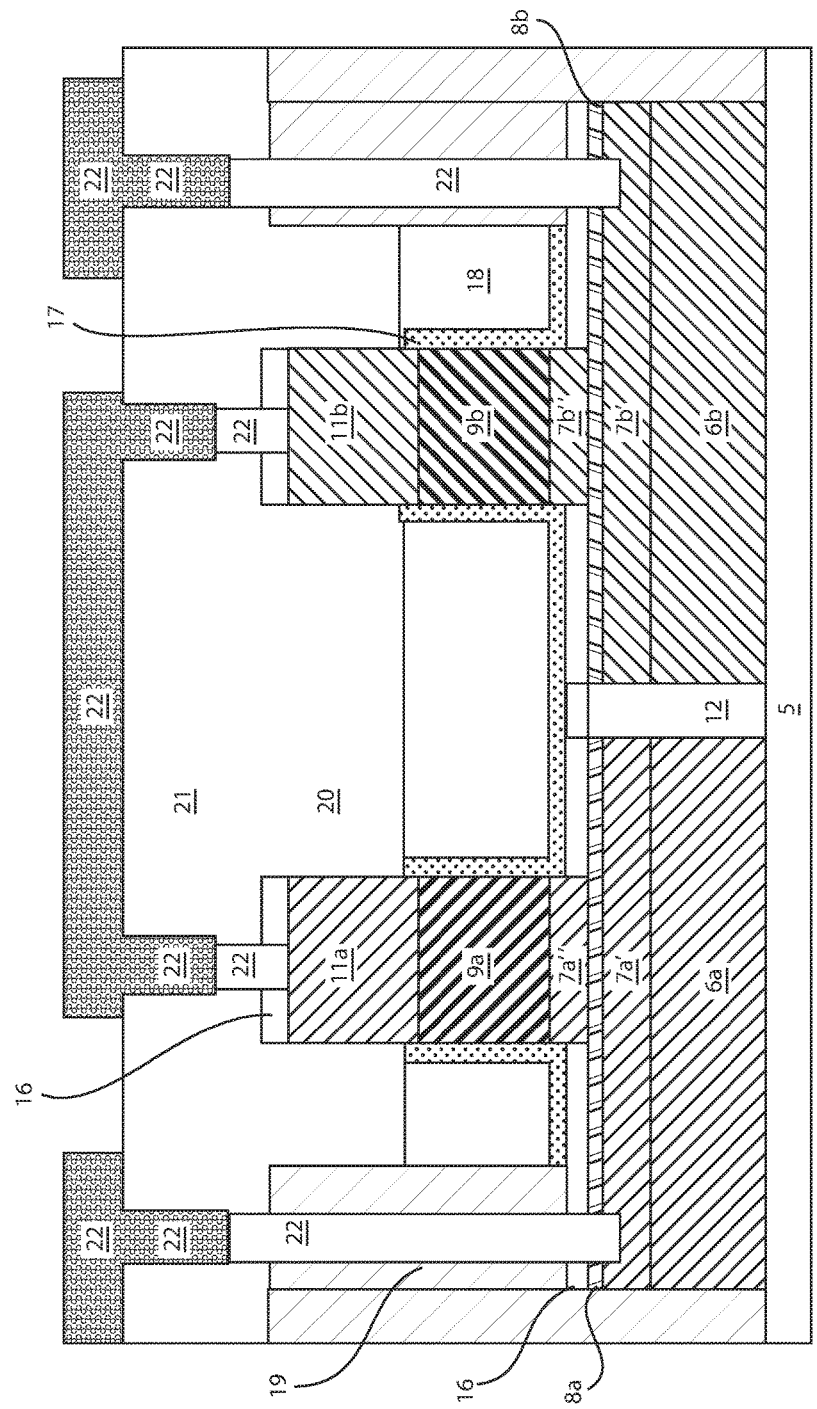
FIG. 7 is a side cross-sectional view depicting forming interconnect to the semiconductor devices formed from the first and second material stacks, in accordance with one embodiment of the present disclosure.

FIG. 7 depicts forming interconnect 22 to the semiconductor devices formed from the first and second material stacks. The interconnect 22 may be produce by forming a via opening through the second interlevel dielectric 21, the second gate sidewall spacer 20, and the first interlevel dielectric 19; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the interconnects 22. The electrically conductive material may be deposited into the via opening using physical vapor deposition (PVD). Examples of PVD processes suitable for depositing the metal for the interconnects 22 include plating, electroplating, electroless plating, sputtering and combinations thereof.

In some embodiments, the method described with reference to FIGS. 1-7 can provide a vertical semiconductor device 100, e.g., vertical fin field effect transistor (vertical FinFET) and/or vertical tunnel field effect transistor (vertical tunnel FET). The semiconductor device may include a first of a source region and a drain region comprised of a first semiconductor material 7a', 7a", 7b', 7b", and an etch stop layer 8a, 8b of a second semiconductor material present within the first of the source region and the drain region 7a', 7a", 7b', 7b". A channel semiconductor material 9a, 9b is present atop the first of the source region and the drain region 7a', 7a", 7b', 7b", and a second of the source and the drain region 11a, 11b is present atop the channel semiconductor material 9a, 9b. In some embodiments, when the first semiconductor material 7a', 7a", 7b', 7b" is composed of indium gallium arsenic (InGaAs), gallium antimony (GaSb) or indium arsenic (InAs), the etch stop layer 8a, 8b may be composed of indium phosphide (InP). In some embodiments, when the first semiconductor material 7a', 7a", 7b', 7b" is composed of silicon germanium (SiGe), the etch stop layer 8a, 8b may be composed of silicon (Si).

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating a vertical fin field effect transistor (FinFET) comprising;
   forming a first source/drain region of first composition epitaxial semiconductor material, wherein a semiconductor etch stop layer of a second epitaxial semiconductor material is present between two layers of the first composition epitaxial semiconductor material for the first source/drain region;
   forming a material layer stack including at least a channel semiconductor material atop the first of the first source/drain region of the device; and
   etching the material layer stack to provide a channel region selectively to the semiconductor etch stop layer.

2. The method of claim 1, further comprising forming a gate structure on the channel region.

3. The method of claim 2, wherein forming the first source/drain region comprises:
   epitaxially growing a first portion of said first epitaxial semiconductor material that is in situ doped atop a strain relaxed buffer layer;
   epitaxially growing the semiconductor etch stop layer on the first portion of the first epitaxial semiconductor material; and
   epitaxially growing a second portion of said first epitaxial semiconductor material that is in situ doped atop the semiconductor etch stop layer.

4. The method of claim 3, wherein the semiconductor etch stop layer comprises an indium and phosphorus containing material.

5. The method of claim 3, wherein said etching the material layer stack to provide a channel region selectively to the semiconductor etch stop layer comprises:
   etching the material stack selectively to the first portion of the first of the source/drain region; and
   etching the first portion of the first source/drain region selectively to the semiconductor etch stop layer, wherein an etched first portion of the first source/drain region has a width equal to a width of the channel semiconductor material, wherein the etched first portion of the first source/drain region that has been etched provides an extension region for the first of the first source/drain region that overlaps with the channel region.

6. The method of claim 5, wherein the material stack comprises a second source/drain region atop the channel semiconductor material.

7. The method of claim 6, wherein forming the gate structure comprises:
   forming a first spacer on the first source/drain region;
   forming a gate dielectric layer on the channel region;
   forming a gate conductor on the gate dielectric and overlying the first spacer; and
   forming a second spacer on the gate conductor, wherein an overlap between the first source/drain region and the channel region of the device is a portion of the first source/drain region that extends past the interface surface of the first spacer with the recessed surface of the first source/drain region.

8. The method of claim 6, wherein the first source/drain region and a second source/drain region have a same conductivity type.

9. A method of fabricating a vertical tunnel field effect transistor comprising;
   forming a first source/drain region having a majority composition of a first epitaxial semiconductor material and a first conductivity type, wherein a semiconductor etch stop layer of a second epitaxial semiconductor material is present within said first source/drain region between two layers of the first composition epitaxial semiconductor material;
   forming a material stack including at least a channel semiconductor material atop the first source/drain region of the device;
   etching the material stack to provide a channel region selectively to the semiconductor etch stop layer; and
   forming a second source/drain region having a second conductivity type positioned on the channel region.

10. The method of claim 9, further comprising forming a gate structure on the channel region.

11. The method of claim 10, wherein forming the first source/drain region comprises:
   epitaxially growing a first portion of said first epitaxial semiconductor material that is in situ doped atop a strain relaxed buffer layer;
   epitaxially growing the semiconductor etch stop layer on the first portion of the first epitaxial semiconductor material; and
   epitaxially growing a second portion of said first epitaxial semiconductor material that is in situ doped atop the semiconductor etch stop layer.

12. The method of claim 11, wherein the first epitaxial semiconductor material comprises a type III-V semiconductor material.

13. The method of claim 12, wherein the semiconductor etch stop layer comprises an indium and phosphorus containing material.

14. The method of claim 11, wherein said etching the material layer stack to provide a channel region selectively to the semiconductor etch stop layer comprises:
   etching the material stack selectively to the first portion of the first source/drain region; and
   etching the first portion of the first source/drain region selectively to the semiconductor etch stop layer, wherein an etched first portion of the first source/drain region has a width equal to a width of the channel semiconductor material, wherein the etched first portion of the first source/drain region that has been etched provides an extension region for the first source/drain region that overlaps with a channel region.

15. The method of claim 14, wherein the second source/drain region is an epitaxial material.

16. A method of forming a semiconductor device comprising:
   forming a first portion of a first source/drain region comprised of a first layer of first semiconductor material having a first conductivity type;
   forming an etch stop layer of a second semiconductor material present on the first layer of the first semiconductor material having the first conductivity type;
   forming a second layer of the first semiconductor material having the first conductivity type present on the etch stop layer to provide a second portion of the first source/drain region;
   forming a channel semiconductor material is present atop the first source/drain region; and
   forming a second source/drain region present atop the channel semiconductor material.

17. The method of claim 16, wherein the etch stop layer comprises indium and phosphorus.

18. The method of claim 16, wherein the first source/drain region and the second source/drain region are doped to a same conductivity type, wherein the semiconductor device is a vertically orientated fin field effect transistor.

19. The method of claim 16, wherein the first source/drain region and the second source/drain region are doped to an opposite conductivity type, wherein the semiconductor device is a vertically orientated tunnel field effect transistor.

20. The method of claim 16, further comprising forming a gate structure.

* * * * *